(12) United States Patent
Abe

(10) Patent No.: US 10,326,419 B2
(45) Date of Patent: Jun. 18, 2019

(54) POWER AMPLIFICATION CIRCUIT

(71) Applicant: Panasonic Corporation, Osaka (JP)

(72) Inventor: Takayuki Abe, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/911,606

(22) Filed: Mar. 5, 2018

(65) Prior Publication Data

US 2018/0278222 A1    Sep. 27, 2018

(30) Foreign Application Priority Data

Mar. 24, 2017    (JP) .................................. 2017-059187

(51) Int. Cl.
*H03F 3/45* (2006.01)
*H03F 3/30* (2006.01)
*H03F 1/02* (2006.01)
*H03F 1/56* (2006.01)
*H03F 3/195* (2006.01)
*H03F 1/34* (2006.01)

(52) U.S. Cl.
CPC ....... *H03F 3/45264* (2013.01); *H03F 1/0216* (2013.01); *H03F 1/347* (2013.01); *H03F 1/56* (2013.01); *H03F 3/195* (2013.01); *H03F 3/3098* (2013.01); *H03F 3/45179* (2013.01); *H03F 2200/222* (2013.01); *H03F 2200/387* (2013.01); *H03F 2203/45318* (2013.01); *H03F 2203/45332* (2013.01); *H03F 2203/45394* (2013.01)

(58) Field of Classification Search
USPC .................................. 330/250, 277, 292, 76
See application file for complete search history.

(56) References Cited

U.S. PATENT DOCUMENTS 9,473,101 B2 * 10/2016 Chan .................... H03G 3/3042
9,735,740 B2 *  8/2017 Jin  ........................... H03F 1/26

OTHER PUBLICATIONS

Hiroki Asada et al., "A 60 GHz CMOS Power Amplifier Using Capacitive Cross-Coupling Neutralization with 16% PAE", European Microwave Conference. (EuMC), Oct. 10, 2011, pp. 554-557.

* cited by examiner

*Primary Examiner* — Hieu P Nguyen
(74) *Attorney, Agent, or Firm* — Greenblum & Bernstein, P.L.C.

(57) ABSTRACT

A power amplification circuit includes a first transistor, which includes a source coupled to a first power supply and receives an input signal at a gate of the first transistor, a capacitor, which includes a first terminal and a second terminal, the first terminal being coupled to a drain of the first transistor, and a transformer, which is coupled between the second terminal and the gate of the first transistor, transforms a first signal input from the second terminal, and outputs a second signal having a phase different from a phase of the first signal to the gate of the first transistor. The first transistor outputs an output signal from the drain of the first transistor.

5 Claims, 8 Drawing Sheets

US 10,326,419 B2

POWER AMPLIFICATION CIRCUIT

BACKGROUND

1. Technical Field

The present disclosure relates to power amplification circuits.

2. Description of the Related Art

With increase in utilization of wireless technology, typified by communications and radars, shortage of frequency bands that can be allocated has been occurring in recent years. To address such frequency shortage, for example, high-frequency bands, which generally include a millimeter wave band and a terahertz band, are utilized. For example, a 60 GHz band is used in communication through a millimeter wave band and a 79 GHz band is used by a millimeter wave radar. Since it is expected that wireless integrated circuits (ICs) that operate using a millimeter wave band and a terahertz band will be more widespread, manufacturing the wireless ICs at low cost is under review.

A typical wireless IC is made of a semiconductor and manufactured by a complementary metal-oxide-semiconductor (CMOS) process. The CMOS process enables manufacture of wireless ICs that are inexpensive, high in integration, and small in size. The wireless ICs manufactured by the CMOS process, however, are low in high-frequency performance and for example, have difficulty in obtaining power gain at high frequencies, compared to those manufactured by another process. To stabilize operation of wireless ICs, stabilization of operation of power amplification circuits and techniques for achieving high gain are under development.

For example, "A 60 GHz CMOS Power Amplifier Using Capacitive Cross-Coupling Neutralization with 16% PAE" in European Microwave Conference (EuMC) 2011 discloses a power amplification circuit, which can achieve stabilization of operation of the power amplification circuit and high gain by employing a cross-coupling capacitor that cancels effect of parasitic capacitance between the gate and drain of a transistor.

SUMMARY

In the circuit disclosed in "A 60 GHz CMOS Power Amplifier Using Capacitive Cross-Coupling Neutralization with 16% PAE" in EuMC 2011, however, power consumption increases because of its configuration where a differential signal is input and output.

One non-limiting and exemplary embodiment provides a power amplification circuit that can inhibit increase in power consumption and enables stable operation with high gain.

In one general aspect, the techniques disclosed here feature a power amplification circuit including a first transistor that has a first source terminal coupled to a first power supply, a first gate terminal for receiving an input signal and a first drain terminal, a capacitor that includes a first terminal and a second terminal, the first terminal being coupled to the first drain terminal, and a transformer that is coupled between the second terminal and the first gate terminal, transforms a first signal input from the second terminal, and outputs a second signal having a phase different from a phase of the first signal to the first gate terminal, the first transistor outputting a first output signal from the first drain terminal.

According to an aspect of the present disclosure, increase in power consumption can be inhibited and stable operation with high gain is enabled.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Examples of a measure to evaluate the performance of a power amplification circuit in a high-frequency band, such as whether gain is high, include the maximum available gain (MAG) and K factor (Kf).

While the MAG indicates the theoretical maximum amplification factor in a configuration of a power amplification circuit, the Kf quantitatively indicates whether the power amplification circuit oscillates. Using Y parameters of the power amplification circuit, $Y_{11}$, $Y_{12}$, $Y_{21}$, and $Y_{22}$, the MAG and Kf are respectively expressed by equations (1) and (2).

$$MAG=|Y_{21}/Y_{12}|*(Kf-(Kf^2-1)^{(1/2)}) \quad (1)$$

$$Kf=(2Re[Y_{11}]Re[Y_{22}]-Re[Y_{12}Y_{21}])/|Y_{12}Y_{21}| \quad (2)$$

It is implied that as the value of the MAG increases, theoretical power loss of the power amplification circuit decreases and a signal can be amplified with the higher efficiency. It is also implied that as the value of the Kf increases, more oscillation of the power amplification circuit can be inhibited and a signal can be amplified more stably. According to equation (1), the MAG can be raised by decreasing the value of $Y_{12}$ and increasing the value of $Y_{21}$. According to equation (2), decrease in MAG can be inhibited and the Kf can be increased by decreasing $Y_{12}$.

Figure 1:
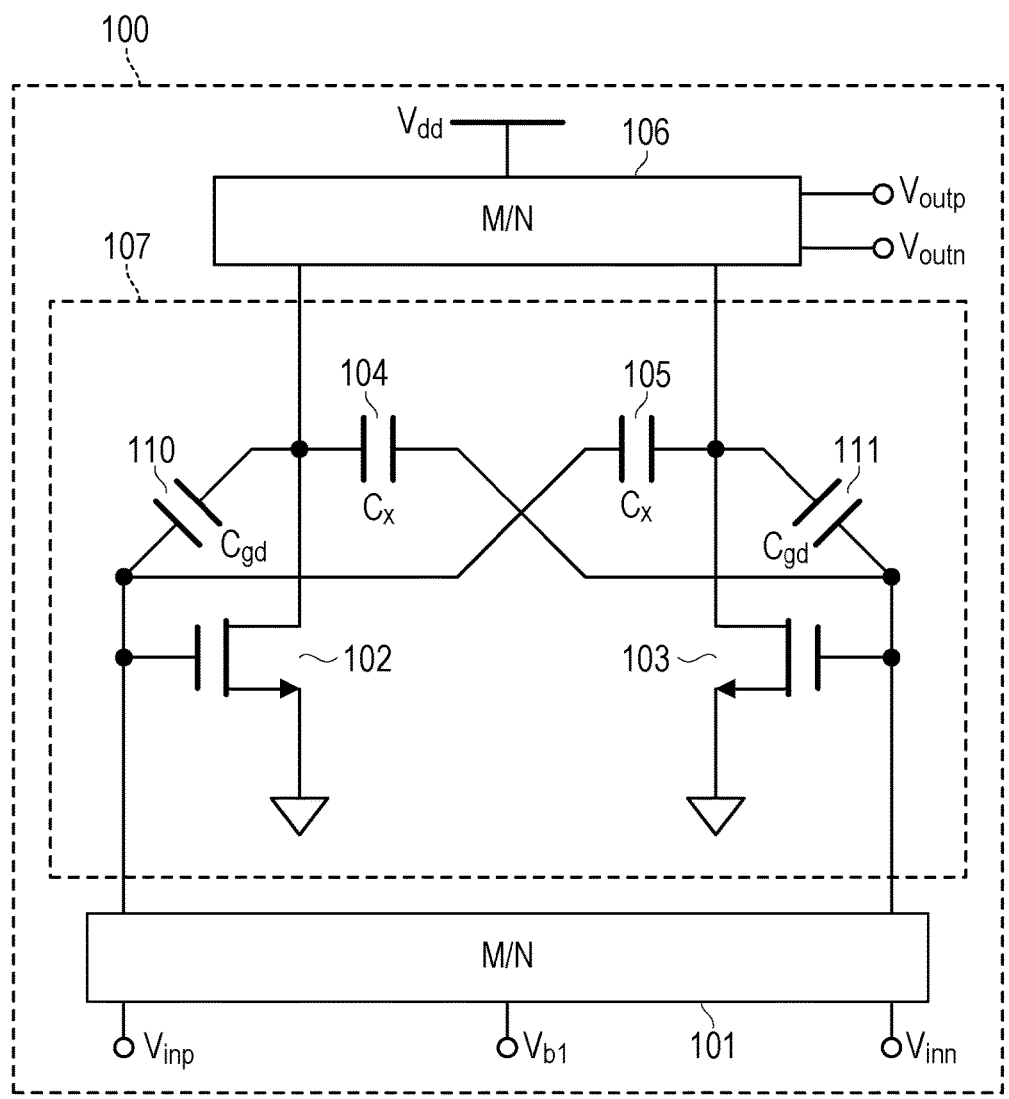
FIG. 1 illustrates a configuration of a differential amplification circuit that uses a cross-coupling capacitor.

Examples of a configuration where a signal in a millimeter wave band is amplified with high efficiency include a differential amplification circuit that uses a cross-coupling capacitor. FIG. 1 illustrates a differential amplification circuit 100 that uses a cross-coupling capacitor.

The differential amplification circuit 100 includes an input circuit 101, a transistor 102, a transistor 103, a capacitor 104, a capacitor 105, and an output circuit 106.

The input circuit 101 is supplied with a gate potential $V_{b1}$ for the transistor 102 and the transistor 103. An input signal $V_{inp}$ and an input signal $V_{inn}$ are input to the input circuit 101. The phase of the input signal $V_{inp}$ and the phase of the input signal $V_{inn}$ are different by 180°. The input circuit 101 performs impedance conversion so as to adjust matching between a core unit 107 and terminals of circuits (not illustrated) that generate the input signal $V_{inp}$ and the input signal $V_{inn}$.

The source terminal of the transistor 102 is grounded. The gate terminal of the transistor 102 is coupled to the input circuit 101. The input signal $V_{inp}$ is input to the gate terminal of the transistor 102 through the input circuit 101.

Parasitic capacitance 110 is present between the gate terminal and drain terminal, hereinafter referred to as between the gate and drain, of the transistor 102. The parasitic capacitance 110 has a capacitance value $C_{gd}$. The parasitic capacitance 110 is not a real circuit element coupled between the gate and drain but illustrated capacitance inherent (parasitic) in the transistor 102.

The source terminal of the transistor 103 is grounded. The gate terminal of the transistor 103 is coupled to the input circuit 101. The input signal $V_{inn}$ is input to the gate terminal of the transistor 103 through the input circuit 101.

Parasitic capacitance 111 is present between the gate and drain of the transistor 103. The parasitic capacitance 111 has a capacitance value $C_{gd}$. The parasitic capacitance 111 is not a real coupled circuit element but illustrated capacitance inherent in the transistor 103.

The capacitor 104 has a capacitance value $C_x$ and is coupled between the drain terminal of the transistor 102 and the gate terminal of the transistor 103. The capacitor 105 has a capacitance value $C_x$ and is coupled between the drain terminal of the transistor 103 and the gate terminal of the transistor 102.

The output circuit 106 is coupled to the drain terminal of the transistor 102 and the drain terminal of the transistor 103. The output circuit 106 is supplied with a drain potential $V_{dd}$ for the transistor 102 and the transistor 103. The output circuit 106 outputs an output signal $V_{outp}$ and an output signal $V_{outn}$. The phase of the output signal $V_{outp}$ and the phase of the output signal $V_{outn}$ are different by 180°.

Further, the output circuit 106 performs impedance conversion so as to adjust matching between the core unit 107 and terminals of circuits (not illustrated) that receive the output signal $V_{outp}$ and the output signal $V_{outn}$.

This configuration enables the differential amplification circuit 100 to cancel effects of the parasitic capacitance 110 between the gate and drain of the transistor 102 and the parasitic capacitance 111 between the gate and drain of the transistor 103.

Equations (3) and (4) express the Y parameters $Y_{12}$ and $Y_{21}$ of the core unit 107 of the differential amplification circuit 100, respectively.

$$Y_{12}=-j\omega(C_{gd}-C_x) \quad (3)$$

$$Y_{21}=g_m-j\omega(C_{gd}-C_x) \quad (4)$$

In equation (4), $g_m$ represents a transconductance value of the transistor 102 and the transistor 103.

According to equations (3) and (4), $Y_{12}$ and $Y_{21}$ can be decreased by the capacitance value $C_x$ cancelling the parasitic capacitance value $C_{gd}$. In particular, as $Y_{12}$ decreases, the value of the MAG expressed by equation (1) increases and the theoretical maximum amplification factor of the differential amplification circuit 100 increases. Since as $Y_{12}$ decreases, the value of the Kf expressed by equation (2) increases, the stability of the differential amplification circuit 100 is enhanced. That is, the amplification factor and stability of the differential amplification circuit 100 can be enhanced by decreasing $Y_{12}$.

The differential amplification circuit 100 illustrated in FIG. 1, however, has a configuration where a differential signal is input and output (a differential configuration), and power consumption increases accordingly.

In view of such circumstances, the present disclosure has been made through noticing that in a power amplification circuit where a single-phase signal is input and output, increase in power consumption can be inhibited and stable operation can be performed with high gain by suppressing effect of parasitic capacitance of a transistor.

Embodiments of the present disclosure are described in detail below by referring to the drawings. The embodiments described below are examples and the present disclosure is not limited by the embodiments below.

First Embodiment

Figure 2:
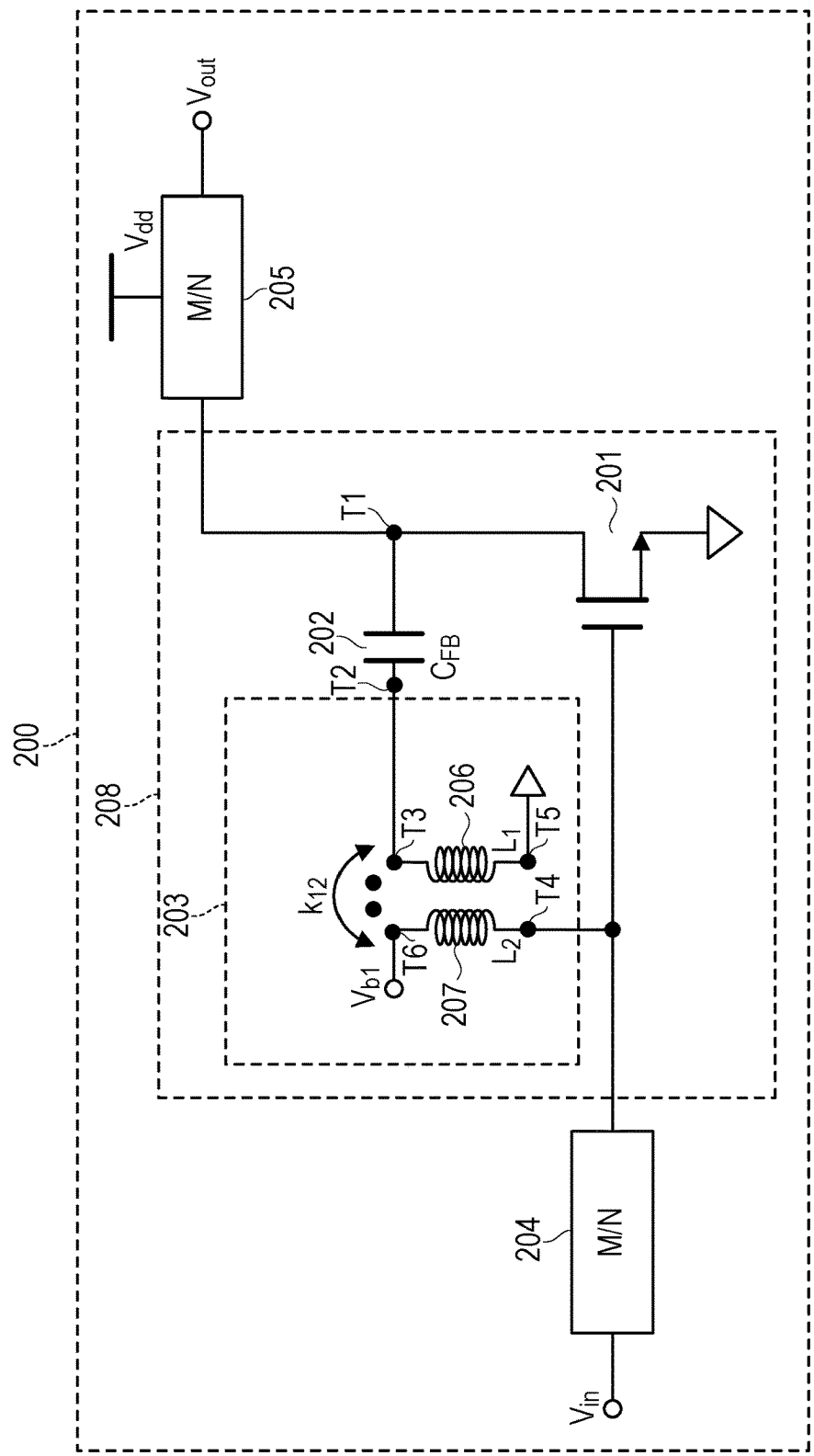
FIG. 2 illustrates a configuration example of a power amplification circuit according to a first embodiment of the present disclosure.

FIG. 2 illustrates a configuration example of a power amplification circuit 200 according to a first embodiment of the present disclosure.

The power amplification circuit 200 illustrated in FIG. 2 includes a transistor 201, a capacitor 202, a transformer 203, an input circuit 204, and an output circuit 205.

The input circuit 204 performs impedance conversion so as to adjust matching between a core unit 208, which includes the transistor 201, the capacitor 202, and the transformer 203, and a terminal of a circuit (not illustrated) that generates an input signal $V_{in}$.

The input signal $V_{in}$ is input to the gate terminal of the transistor 201 through the input circuit 204. The source terminal of the transistor 201 is coupled to a ground (GND) and supplied with a voltage of 0 V. The source terminal of the transistor 201 may be coupled to a DC power supply that supplies a voltage except 0 V. The drain terminal of the transistor 201 is coupled to the output circuit 205.

The capacitor 202 includes a terminal T1 and a terminal T2. The capacitor 202 has a capacitance value $C_{FB}$. The terminal T1 is coupled to the drain terminal of the transistor 201.

The transformer 203 is coupled between the terminal T2 of the capacitor 202 and the gate terminal of the transistor 201. The transformer 203 transforms a signal input from the terminal T2 and outputs a signal having a phase opposite that of the input signal to the drain terminal of the transistor 201.

The transformer 203 includes an inductor 206 and an inductor 207.

The inductor 206 includes a terminal T3 and a terminal T5. The inductor 206 has an inductance value $L_1$. The terminal T3 is coupled to the terminal T2 of the capacitor 202. The terminal T5 is coupled to the GND and supplied with a voltage of 0 V. The terminal T5 may be coupled to a DC power supply that supplies a voltage except 0 V.

The inductor 207 includes a terminal T4 and a terminal T6. The inductor 206 has an inductance value $L_2$. The terminal T4 is coupled to the gate terminal of the transistor 201. The terminal T6 is coupled to a DC power supply (not illustrated) and supplied with a voltage of $V_{b1}$ V. $V_{b1}$ is set to a value independent of a drain potential $V_{dd}$, which is described below. When the voltage supplied to the source terminal of the transistor 201 is 0 V, $V_{b1}$ is for example, 0.4 V to 0.75 V.

The transformer 203 is formed through magnetic-field coupling between the inductor 206 and the inductor 207. The coupling coefficient of the inductor 206 and the inductor 207 is represented by $k_{12}$.

The output circuit 205 is supplied with the drain potential $V_{dd}$, which is input to the transistor 201. When the voltage supplied to the source terminal of the transistor 201 is 0 V, the drain potential $V_{dd}$ is for example, 0.9 V. The output circuit 205 outputs a signal output from the drain of the transistor 201 as an output signal $V_{out}$. Further, the output circuit 205 performs impedance conversion so as to adjust matching between the core unit 208 and a terminal of a circuit (not illustrated) that receives the output signal $V_{out}$.

The values of $V_{b1}$ and $V_{dd}$ are changed according to the voltage supplied to the source terminal of the transistor 201.

This configuration enables it to attain a power amplification circuit having the MAG and Kf that are equivalent to those of the differential amplification circuit 100 illustrated in FIG. 1. Described below are the MAG and Kf of the power amplification circuit 200.

The Y parameters of the core unit 208 of the power amplification circuit 200 are expressed by equations (5) and (6).

$$Y_{12}=-j\omega[C_{gd}-(MC_{FB})/\{L_2-(\omega^2)C_{FB}(L_1L_2-M^2)\}] \qquad (5)$$

$$Y_{21}=g_m-j\omega[C_{gd}-(MC_{FB})/\{L_2-(\omega^2)C_{FB}(L_1L_2-M^2)\}] \qquad (6)$$

In equations (5) and (6), $C_{gd}$ represents the capacitance value of the parasitic capacitance between the gate and drain of the transistor 201, $L_1$ represents the inductance value of the inductor 206, $L_2$ represents the inductance value of the inductor 207, $g_m$ represents the transconductance value of the transistor 201, and M represents the mutual inductance value of the transformer 203. Using the coupling coefficient kit of the transformer 203, $L_1$, and $L_2$, M is expressed by equation (7).

$$M=k_{12}(L_1L_2)^{(1/2)} \qquad (7)$$

According to equations (5) and (6), effect of the parasitic capacitance between the gate and drain of the transistor 201 can be cancelled by determining the parameters of the power amplification circuit 200, which are for example, the coupling coefficient $k_{12}$ of the transformer 203, the inductance value $L_1$ of the inductor 206, the inductance value $L_2$ of the inductor 207, and the capacitance value $C_{FB}$ of the capacitor 202, so as to satisfy equation (8).

$$C_{gd}=(MC_{FB})/\{L_2-(\omega^2)C_{FB}(L_1L_2-M^2)\} \qquad (8)$$

When $L_1=L_2$ and $k_{12}=1$ for example, equation (8) is expressed as equation (9).

$$C_{gd}=C_{FB} \qquad (9)$$

That is, when $L_1=L_2$ and $k_{12}=1$, effect of the parasitic capacitance between the gate and drain of the transistor 201 can be cancelled by determining the parameters of the power amplification circuit 200 so that $C_{FB}=C_{gd}$.

Although $L_1=L_2$ and $k_{12}=1$ for simplification for example and on this condition, the optimum solution is that $C_{FB}=C_{gd}$, the optimum solution changes according to the condition. Although an example where $L_1=L_2$ and $k_{12}=1$ is presented, the parameters need not be exactly equal only when the parameters can approximate each other.

For example, when $L_1=L_2$ and $k_{12}=1$, the Y parameters in equations (5) and (6) can be expressed as equations (10) and (11).

$$Y_{12}=-j\omega(C_{gd}-C_{FB}) \qquad (10)$$

$$Y_{21}=g_m-j\omega(C_{gd}-C_{FB}) \qquad (11)$$

According to equations (10) and (11), effect of the parasitic capacitance between the gate and drain of the transistor 201 can be cancelled by determining the parameters of the power amplification circuit 200 so that $L_1=L_2$, $k_{12}=1$, and $C_{FB}=C_{gd}$, and then $Y_{12}$ is the minimum and $Y_{21}$ is the maximum.

Figure 3A:
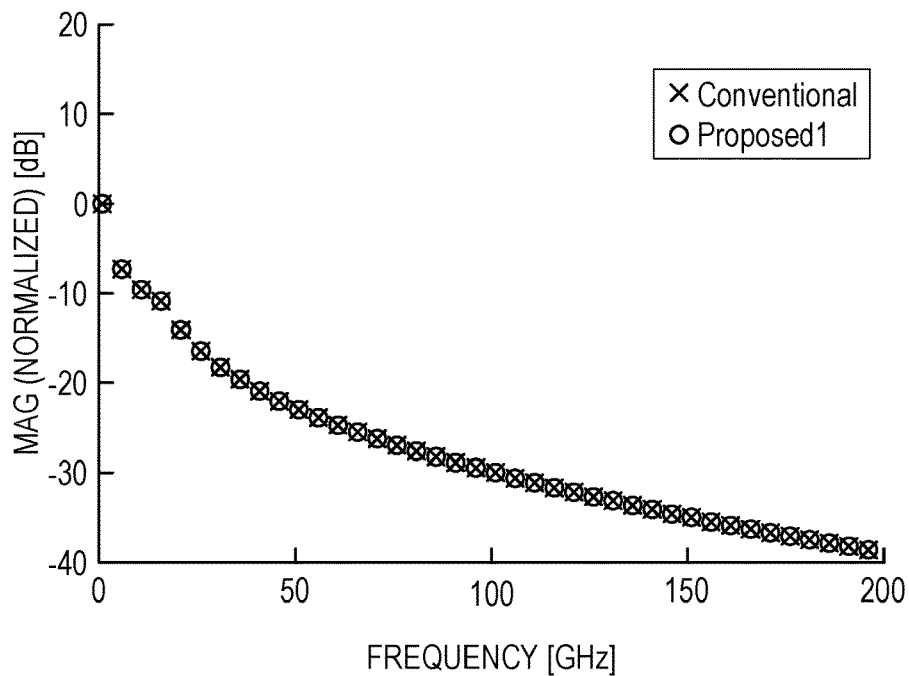
FIG. 3A illustrates MAG characteristics of the power amplification circuit according to the first embodiment of the present disclosure.
Figure 3B:
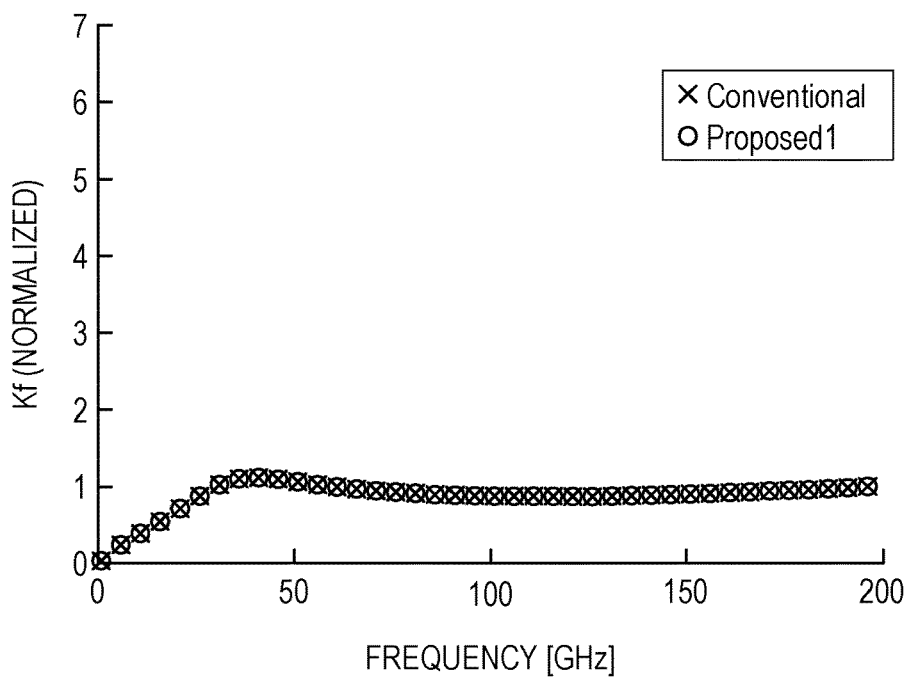
FIG. 3B illustrates Kf characteristics of the power amplification circuit according to the first embodiment of the present disclosure.

Next, MAG characteristics and Kf characteristics of the power amplification circuit 200 are described by referring to FIGS. 3A and 3B.

FIG. 3A illustrates the MAG characteristics of the power amplification circuit 200 according to the first embodiment. FIG. 3B illustrates the Kf characteristics of the power amplification circuit 200 according to the first embodiment. In FIGS. 3A and 3B, "Proposed1" indicates the characteristics of the power amplification circuit 200 and "Conventional" indicates the characteristics of the differential amplification circuit 100 in FIG. 1. In FIGS. 3A and 3B, the horizontal axis indicates the frequency of a signal input to and output from the power amplification circuit. In FIG. 3A, the vertical axis indicates the value of the MAG normalized using the maximum value of the MAG of the power amplification circuit 200. In FIG. 3B, the vertical axis indicates the value of the Kf normalized using the maximum value of the Kf of the power amplification circuit 200.

The parameters of the power amplification circuit 200 in FIGS. 3A and 3B are set so that $L_1=L_2=200$ pH, $k_{12}=1$, and $C_{FB}=C_{gd}$.

In FIGS. 3A and 3B, the power amplification circuit 200 has characteristics equivalent to those of the differential amplification circuit 100. The power consumption of the power amplification circuit 200 with a single-phase configuration is approximately half the power consumption of the differential amplification circuit 100 with a differential configuration. That is, the power amplification circuit 200 can obtain the amplification factor and stability equivalent to those obtained by the differential amplification circuit 100 with approximately half of the power consumption of the differential amplification circuit 100.

Described above is an example where the coupling coefficient $k_{12}$ of the transformer 203 is 1, that is, $k_{12}=1$. When $k_{12}=1$, $M=L_1L_2^{(1/2)}$ and that $L_1L_2-M^2=0$ is satisfied accordingly. In this case, the right side of the equation (8) does not depend on the change in frequency since $(\omega^2)C_{FB}(L_1L_2-M^2)=0$.

When the coupling coefficient $k_{12}$ of the transformer 203 is not 1, that is, $k_{12}\neq 1$, the right side of the equation (8) changes, depending on the change in frequency. That is, when $k_{12}\neq 1$, $(\omega^2)C_{FB}(L_1L_2-M^2)\neq 0$ and thus, the right side of the equation (8) has frequency characteristics. Even when $k_{12}\neq 1$, variation in characteristics according to the change in frequency can be inhibited by setting $L_1$ and $L_2$ so that $L_1$ and $L_2$ are small.

When for example, it is set that $L_1=L_2=L$, the condition of $C_{FB}$ that makes $Y_{12}$ the minimum and $Y_{21}$ the maximum is expressed as equation (12).

$$C_{FB}=C_{gd}/\{k_{12}+(\omega^2)C_{gd}L(1-k_{12}^2)\} \quad (12)$$

The capacitance value $C_{FB}$ of the capacitor 202 is set to the value indicated in equation (14) by determining L on the basis of equation (12) so that the condition of expression (13) is satisfied.

$$L<<k_{12}/\{(\omega^2)C_{gd}(1-k_{12}^2)\} \quad (13)$$

$$C_{FB}=C_{gd}/k_{12} \quad (14)$$

Since $0<k_{12}\leq 1$, on the condition that $C_{FB}\geq C_{gd}$, $Y_{12}$ has a value close to the minimum value and $Y_{21}$ has a value close to the maximum value.

Difference in characteristics between cases where $k_{12}=1$ and where $k_{12}\neq 1$ is described below by referring to FIGS. 4A and 4B.

Figure 4A:
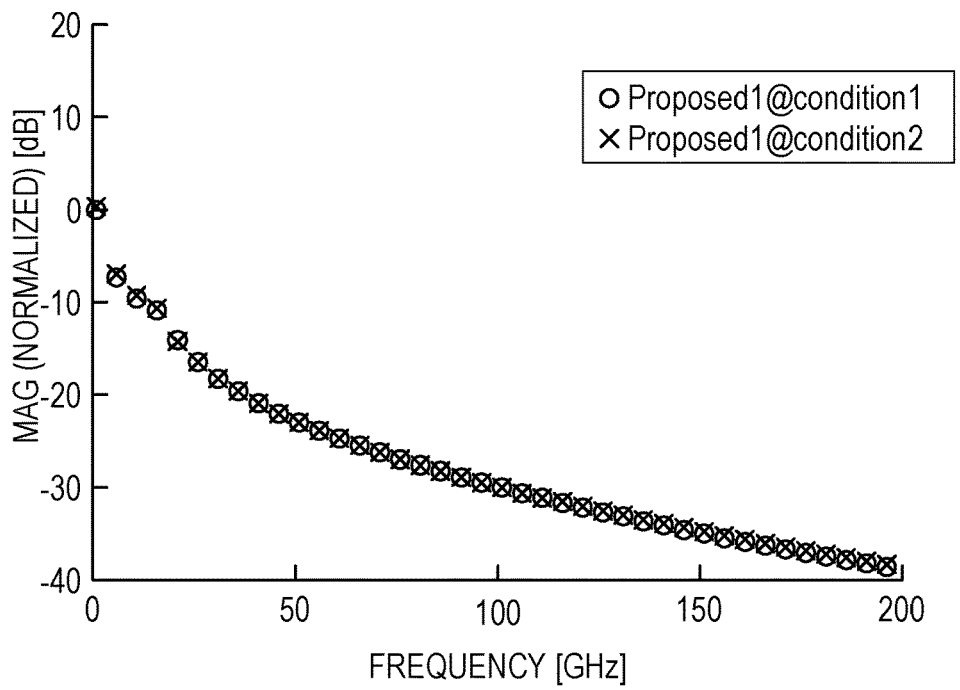
FIG. 4A illustrates MAG characteristics of a power amplification circuit that includes a transformer different in coupling coefficient.

FIG. 4A illustrates the MAG characteristics of the power amplification circuit 200 that includes a transformer different in coupling coefficient. FIG. 4B illustrates the Kf characteristics of the power amplification circuit 200 that includes a transformer different in coupling coefficient. In FIGS. 4A and 4B, "Proposed1@condition1" indicates the characteristics of the power amplification circuit 200 having a parameter set, $L_1=L_2=200$ pH, $k_{12}=1$, and $C_{FB}=C_{gd}$ while "Proposed1@condition2" indicates the characteristics of the power amplification circuit having a parameter set, $L_1=L_2=50$ pH, $k_{12}=0.7$, and $C_{FB}=C_{gd}/0.7$. In FIGS. 4A and 4B, the horizontal axis indicates the frequency of a signal input to and output from the power amplification circuit. In FIG. 4A, the vertical axis indicates the value of the MAG normalized using the maximum value of the MAG of the power amplification circuit 200 according to the condition 1. In FIG. 4B, the vertical axis indicates the value of the Kf normalized using the maximum value of the Kf of the power amplification circuit 200 according to the condition 1.

Figure 4B:
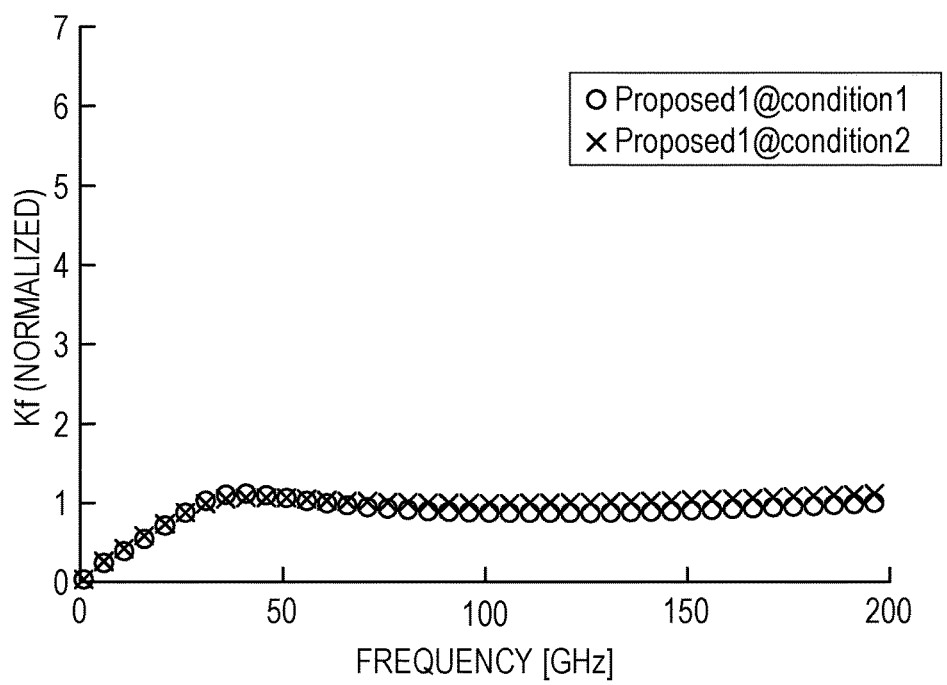
FIG. 4B illustrates Kf characteristics of the power amplification circuit that includes a transformer different in coupling coefficient.

In FIGS. 4A and 4B, "Proposed1@condition2" is equivalent in characteristics to "Proposed1@condition1". That is, even when the coupling coefficient of the transformer 203 is a value different from 1, the power amplification circuit 200 can obtain the amplification factor and stability equivalent to those obtained when the coupling coefficient of the transformer 203 is 1 by setting the parameters suitably. As a result, even when the coupling coefficient is not 1, high gain and high stability can be attained over a wide band.

As described above, the power amplification circuit 200 according to the first embodiment includes the transistor 201 (a first transistor), which includes a source coupled to a first power supply such as the GND and receives an input signal at its gate, the capacitor 202, which has the terminal T1 (a first terminal) and the terminal T2 (a second terminal), the terminal T1 being coupled to the drain of the transistor 201, and the transformer 203, which is coupled between the terminal T2 and the gate of the transistor 201, transforms a signal (a first signal) input from the terminal T2, and outputs a signal (a second signal) having a phase opposite that of the input signal to the gate of the transistor 201, and the transistor 201 outputs an output signal from its drain.

This configuration enables a signal having a phase different from that of a signal output from the drain terminal of the transistor 201 to return to the gate terminal of the transistor 201 for a certain amount in the power amplification circuit 200 with a single-phase configuration and thus, effect of the parasitic capacitance between the gate and drain of the transistor 201 can be suppressed. Consequently, the power amplification circuit 200 with a single-phase configuration can inhibit increase in power consumption and enables stable operation with high gain.

Although an example where the above-described transformer 203 outputs a signal having an opposite phase to the gate terminal of the transistor 201 is described, the present disclosure is not limited to this example. The transformer 203 may output a signal having a phase different from that of the input signal to the gate terminal of the transistor 201. Even in this case, effect of the parasitic capacitance can be suppressed.

Although an example where the above-described transformer 203 is made up of two inductors that are magnetic-field coupled is described, the present disclosure is not limited to this example. The transformer 203 may include an equivalent circuit the same as the two inductors that are magnetic-field coupled and it is sufficient for the transformer 203 to have a configuration where a signal having a phase different from that of a signal input from the drain terminal of the transistor 201 through the terminal T2 can be output to the gate terminal of the transistor 201.

Second Embodiment

Figure 5:
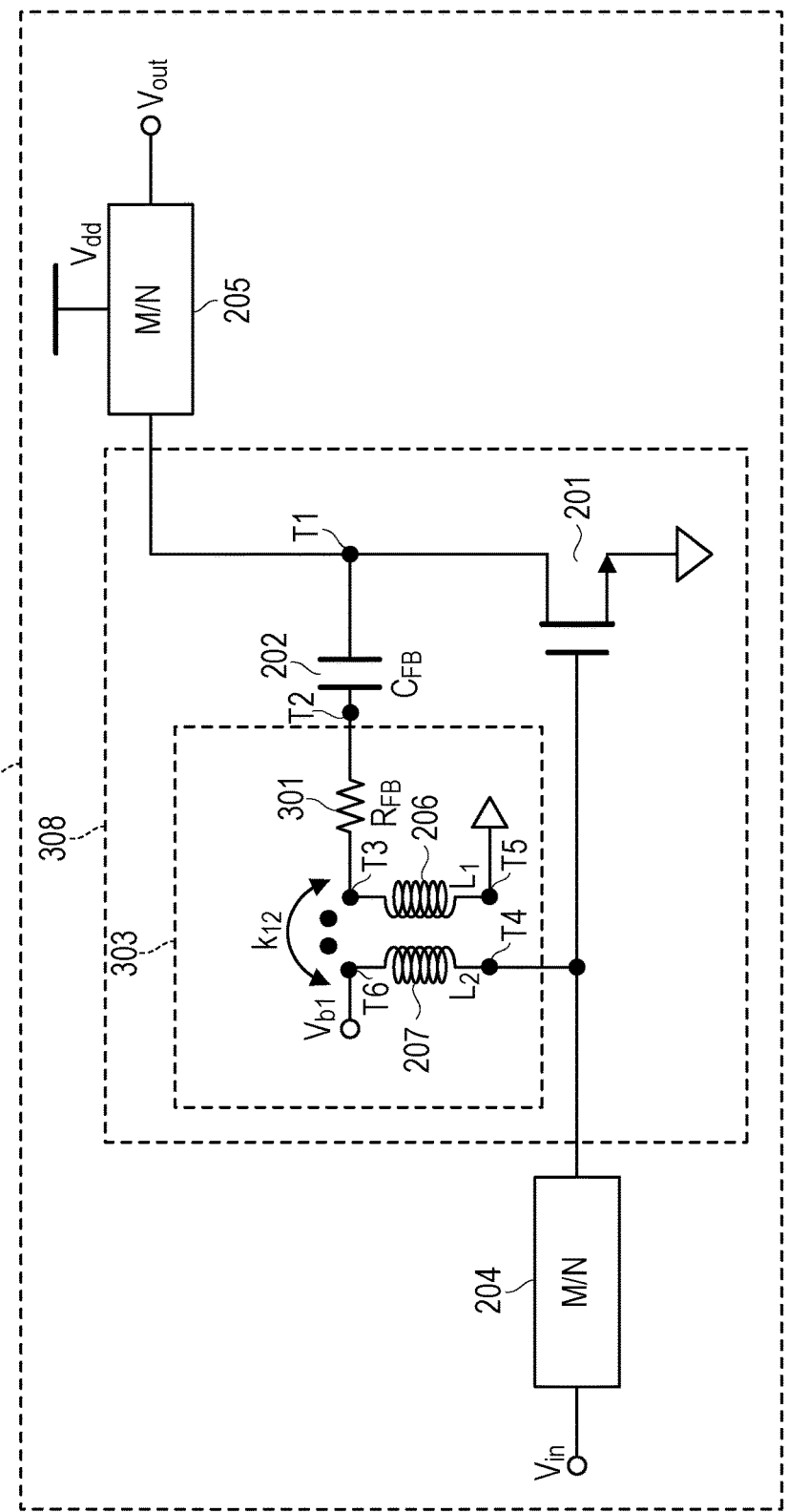
FIG. 5 illustrates a configuration example of a power amplification circuit according to a second embodiment of the present disclosure.

FIG. 5 illustrates a configuration example of a power amplification circuit 300 according to a second embodiment. In FIG. 5, identical reference denotations are given to constituent parts similar to those in FIG. 2 and descriptions thereof are omitted.

In a core unit 308 of the power amplification circuit 300, the transformer 203 of the power amplification circuit 200 in FIG. 2 is replaced with a transformer 303.

The transformer 303 includes an inductor 206, an inductor 207, and a resistor 301.

The resistor 301 is coupled in series to the inductor 206. The resistor 301 has a resistance value $R_{FB}$. The resistor 301 may be a metal resistor or be a wiring resistor that uses part of a wiring pattern. The resistance value $R_{FB}$ is for example, approximately a few ohms to a few tens of ohms.

Although FIG. 5 illustrates an example where the resistor 301 is coupled between a terminal T2 of a capacitor 202 and a terminal T3 of the inductor 206, the resistor 301 may be coupled between a terminal T5 of the inductor 206 and the GND. For another example, the resistor 301 may be coupled to both of the capacitor 202 and the GND by for example, being replaced with two resistors that each have a resistance value of $R_{FB}/2$. For another example, the resistor 301 may be coupled between the capacitor 202 and the drain terminal of a transistor 201.

Figure 6A:
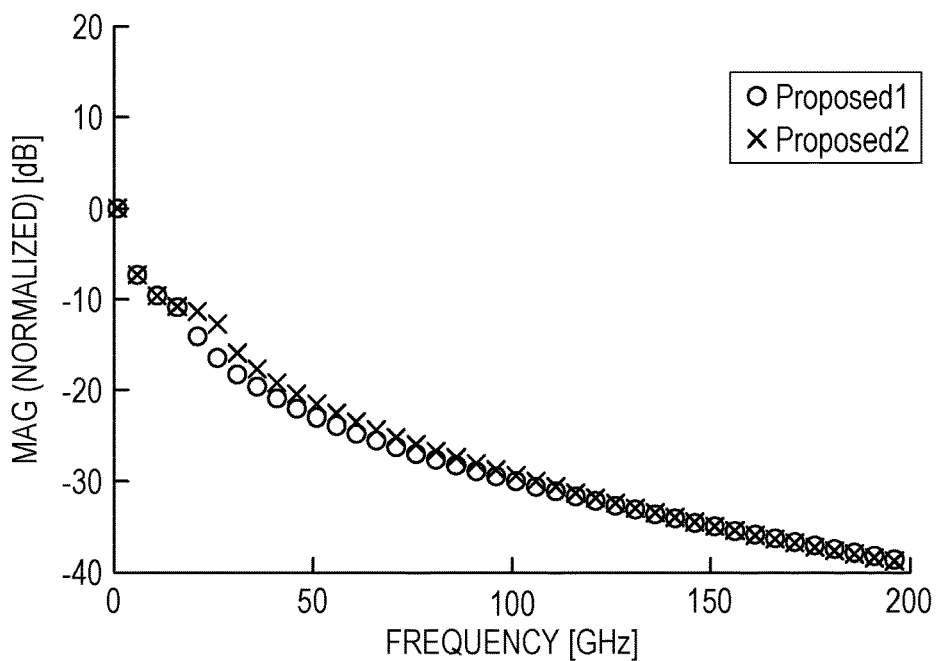
FIG. 6A illustrates MAG characteristics of the power amplification circuit according to the second embodiment of the present disclosure.
Figure 6B:
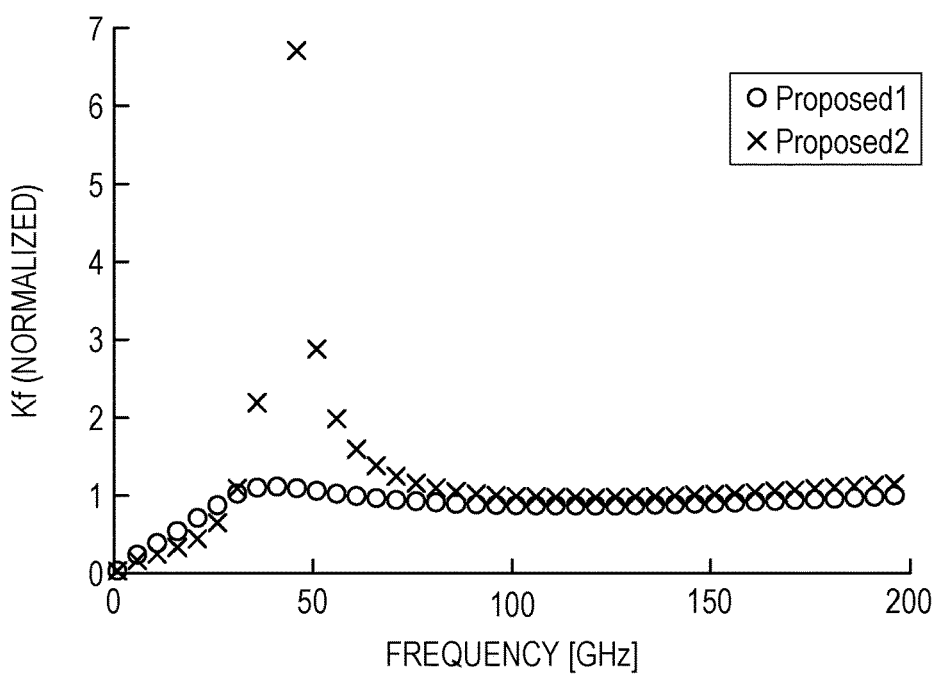
FIG. 6B illustrates Kf characteristics of the power amplification circuit according to the second embodiment of the present disclosure.

Next, MAG characteristics and Kf characteristics of the power amplification circuit 300 are described by referring to FIGS. 6A and 6B.

FIG. 6A illustrates the MAG characteristics of the power amplification circuit 300 according to the second embodiment. FIG. 6B illustrates the Kf characteristics of the power amplification circuit 300 according to the second embodiment. In FIGS. 6A and 6B, "Proposed1" indicates the characteristics of the power amplification circuit 200 and "Proposed2" indicates the characteristics of the power amplification circuit 300. In FIGS. 6A and 6B, the horizontal axis indicates the frequency of a signal input to and output from the power amplification circuit. In FIG. 6A, the vertical axis indicates the value of the MAG normalized using the maximum value of the MAG of the power amplification circuit 200. In FIG. 6B, the vertical axis indicates the value of the Kf normalized using the maximum value of the Kf of the power amplification circuit 200.

In FIGS. 6A and 6B, the parameters of the power amplification circuit 200 are set so that $L_1=L_2=200$ pH, $k_{12}=1$, and $C_{FB}=C_{gd}$, while the parameters of the power amplification circuit 300 are set so that $L_1=L_2=200$ pH, $k_{12}=1$, $C_{FB}=C_{gd}$, and $R_{FB}=34.4\Omega$).

According to FIGS. 6A and 6B, the MAG characteristics and Kf characteristics of the power amplification circuit 300 are enhanced more at certain frequencies than the power amplification circuit 200.

As described above, the power amplification circuit 300 according to the second embodiment includes the resistor 301 coupled in series to the inductor 206. This configuration enables effect of a parasitic element other than the parasitic capacitance of the transistor 201 to be suppressed and thus, at certain frequencies, the MAG characteristics and Kf characteristics can be further enhanced.

Third Embodiment

Figure 7:
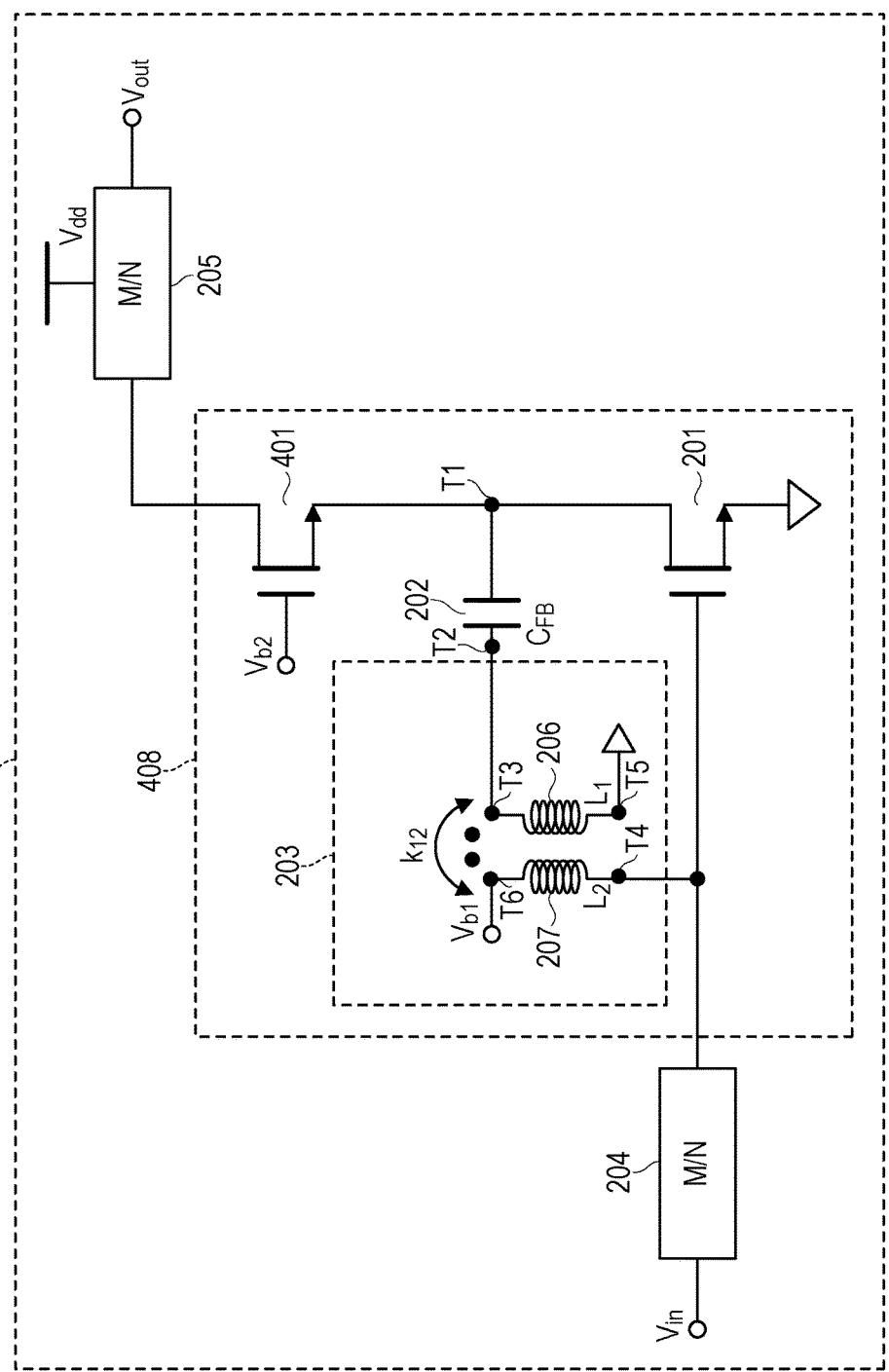
FIG. 7 illustrates a configuration example of a power amplification circuit according to a third embodiment of the present disclosure.

FIG. 7 illustrates a configuration example of a power amplification circuit 400 according to a third embodiment. In FIG. 7, identical reference denotations are given to constituent parts similar to those in FIG. 2 and descriptions thereof are omitted.

Compared to the power amplification circuit 200 in FIG. 2, a transistor 401 is added to a core unit 408 in the power amplification circuit 400.

The transistor 401 is a cascode transistor that undergoes concatenation with (is cascode-coupled to) a transistor 201. The gate terminal of the transistor 401 is coupled to a DC power supply and supplied with a voltage of $V_{b2}$ V. Although being set independently of $V_{dd}$, $V_{b2}$ is for example, identical in value to $V_{dd}$, such as 0.9 V to 1.8 V. Further, $V_{b2}$ is set to a value independent of $V_{b1}$. For example, $V_{b2}$ is larger in value than $V_{b1}$. The source terminal of the transistor 401 is coupled to the drain terminal of the transistor 201.

The drain terminal of the transistor 401 is coupled to an output circuit 205. The output circuit 205 outputs a signal output from the drain terminal of the transistor 401 as an output signal $V_{out}$.

Although an example where $V_{b2}$ is larger than $V_{b1}$ is described, $V_{b2}$ may be equal to $V_{b1}$. Although an example where the values of $V_{b2}$ and $V_{dd}$ are identical is described, the values of $V_{b2}$ and $V_{dd}$ may be different. The values of $V_{b1}$, $V_{b2}$, and $V_{dd}$ may be changed according to the voltage supplied to the source terminal of the transistor 201.

Figure 8A:
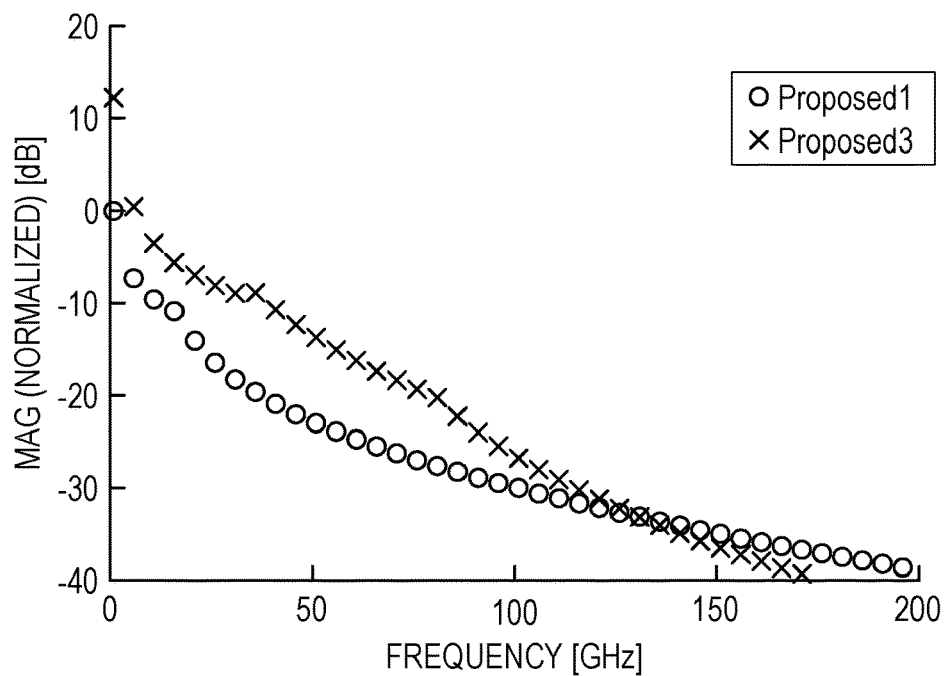
FIG. 8A illustrates MAG characteristics of the power amplification circuit according to the third embodiment of the present disclosure.
Figure 8B:
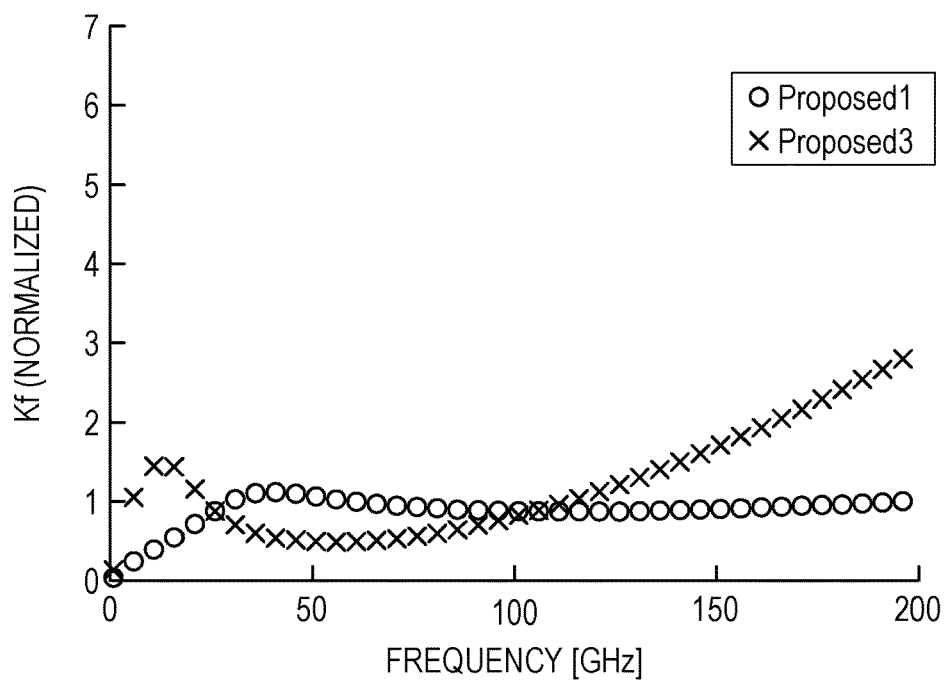
FIG. 8B illustrates Kf characteristics of the power amplification circuit according to the third embodiment of the present disclosure.

Next, MAG characteristics and Kf characteristics of the power amplification circuit 400 are described by referring to FIGS. 8A and 8B.

FIG. 8A illustrates the MAG characteristics of the power amplification circuit 400 according to the third embodiment. FIG. 8B illustrates the Kf characteristics of the power amplification circuit 400 according to the third embodiment. In FIGS. 8A and 8B, "Proposed1" indicates the characteristics of the power amplification circuit 200 and "Proposed3" indicates the characteristics of the power amplification circuit 400. In FIGS. 8A and 8B, the horizontal axis indicates the frequency of a signal input to and output from the power amplification circuit. In FIG. 8A, the vertical axis indicates the value of the MAG normalized using the maximum value of the MAG of the power amplification circuit 200. In FIG. 8B, the vertical axis indicates the value of the Kf normalized using the maximum value of the Kf of the power amplification circuit 200.

In FIGS. 8A and 8B, the parameters of the power amplification circuit 200 and the power amplification circuit 400 are set so that $L_1=L_2=200$ pH, $k_{12}=1$, and $C_{FB}=C_{gd}$.

According to FIGS. 8A and 8B, the MAG characteristics and Kf characteristics of the power amplification circuit 400 can be further enhanced at certain frequencies. Although the Kf characteristics of the power amplification circuit 400 are lower than those of the power amplification circuit 200 at partial frequencies, the MAG characteristics of the power amplification circuit 400 are enhanced more at the partial frequencies than the power amplification circuit 200.

As described above, the power amplification circuit 400 according to the third embodiment includes the transistor 401 (a second transistor), which includes a source coupled to the drain of the transistor 201 (a first transistor), includes a gate coupled to a DC power supply (a fourth power supply), and outputs an output signal from its drain. Since this configuration can decrease the Y parameter $Y_{12}$, the MAG characteristics and Kf characteristics can be further enhanced at certain frequencies.

Although the third embodiment describes an example where a single transistor is cascode-coupled to the transistor 201, the present disclosure is not limited to this example. The number of transistors cascode-coupled to the transistor 201 may be two or more.

The third embodiment and the above-described second embodiment may be combined. For example, the power amplification circuit 400 may include a resistor coupled in series to the inductor 206.

Although various embodiments are described above by referring to the drawings, the present disclosure is not limited to these examples. A person skilled in the art can reach various other changes or modifications within the category described in the aspects of the present disclosure and such changes or modifications should be understood as belonging to the technical scope of the present disclosure. The constituent elements in the above-described embodiments may be combined as desired within the scope not departing from the spirit of the present disclosure.

Outlines of the Present Disclosure

A power amplification circuit according to the present disclosure includes a first transistor that has a first source terminal coupled to a first power supply, a first gate terminal for receiving an input signal and a first drain terminal, a capacitor that includes a first terminal and a second terminal, the first terminal being coupled to the first drain terminal, and a transformer that is coupled between the second terminal and the first gate terminal, transforms a first signal input from the second terminal, and outputs a second signal having a phase different from a phase of the first signal to the first gate terminal, the first transistor outputting a first output signal from the first drain terminal.

In the power amplification circuit according to the present disclosure, the transformer may include a first inductor that includes a third terminal coupled to the second terminal and a fifth terminal coupled to a second power supply, and a second inductor that includes a fourth terminal coupled to the first gate terminal and a sixth terminal coupled to a third power supply and performs magnetic-field coupling with the first inductor.

In the power amplification circuit according to the present disclosure, an inductance value of the first inductor may be approximately equal to an inductance value of the second inductor.

In the power amplification circuit according to the present disclosure, the capacitor may have a capacitance value determined according to an inductance value of the first inductor, an inductance value of the second inductor, a coupling coefficient of the transformer, and a capacitance value of parasitic capacitance between the first gate terminal and the first drain terminal.

The power amplification circuit according to the present disclosure may include a resistor that is provided between the second terminal and the second power supply and coupled in series to the first inductor.

The power amplification circuit according to the present disclosure may further include a second transistor that has a second source terminal coupled to the first drain terminal, a second gate terminal coupled to a fourth power supply and a second drain terminal outputting a second output signal.

The power amplification circuit according to the present disclosure is useful for high-resolution radars and high-speed communications.

What is claimed is:

1. A power amplification circuit, comprising:
    a first transistor that has a first source terminal coupled to a first power supply, a first gate terminal for receiving an input signal and a first drain terminal, the first transistor outputting a first output signal from the first drain terminal;
    a capacitor that includes a first terminal and a second terminal, the first terminal being coupled to the first drain terminal; and
    a transformer that is coupled between the second terminal and the first gate terminal, transforms a first signal input from the second terminal, and outputs a second signal having a phase different from a phase of the first signal to the first gate terminal,
    wherein the transformer includes
        a first inductor that includes a third terminal coupled to the second terminal and a fifth terminal coupled to a second power supply, and
        a second inductor that includes a fourth terminal coupled to the first gate terminal and a sixth terminal coupled to a third power supply and performs magnetic-field coupling with the first inductor.

2. The power amplification circuit according to claim 1, wherein an inductance value of the first inductor is approximately equal to an inductance value of the second inductor.

3. The power amplification circuit according to claim 1, wherein the capacitor has a capacitance value determined according to an inductance value of the first inductor, an inductance value of the second inductor, a coupling coefficient of the transformer, and a capacitance value of parasitic capacitance between the first gate terminal and the first drain terminal.

4. The power amplification circuit according to claim 1, comprising:
    a resistor that is provided between the second terminal and the second power supply and coupled in series to the first inductor.

5. The power amplification circuit according to claim 1, comprising:
    a second transistor that has a second source terminal coupled to the first drain terminal, a second gate terminal coupled to a fourth power supply and a second drain terminal outputting a second output signal.

* * * * *